US009748955B1

(12) United States Patent
Gasiot et al.

(10) Patent No.: US 9,748,955 B1
(45) Date of Patent: Aug. 29, 2017

(54) RADIATION-HARDENED CMOS LOGIC DEVICE

(71) Applicant: STMicroelectronics (Crolles 2) SAS, Crolles (FR)

(72) Inventors: Gilles Gasiot, Seyssinet-Pariset (FR); Victor Malherbe, Grenoble (FR); Sylvain Clerc, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/363,041

(22) Filed: Nov. 29, 2016

(30) Foreign Application Priority Data

Apr. 5, 2016 (FR) ..................................... 16 52999

(51) Int. Cl.

| | |
|---|---|
| ***H03K 19/00*** | (2006.01) |
| ***H03K 19/003*** | (2006.01) |
| ***H03K 19/21*** | (2006.01) |
| ***H01L 27/092*** | (2006.01) |
| ***H01L 21/8238*** | (2006.01) |

(52) U.S. Cl.
CPC .................. *H03K 19/00338* (2013.01); *H01L 21/823892* (2013.01); *H01L 27/0928* (2013.01); *H03K 19/21* (2013.01)

(58) Field of Classification Search
None
See application file for complete search history.

(56) References Cited

U.S. PATENT DOCUMENTS

| | | | |
|---|---|---|---|
| 5,220,218 | A | 6/1993 | Hill et al. |
| 5,418,473 | A | 5/1995 | Canaris |
| 2006/0119410 | A1 | 6/2006 | Carlson |

OTHER PUBLICATIONS

Mavis, et al., "SEU and SET Modelling and Mitigation in Deep Submicron Technologies", IEEE 07CH37867, 45th Annual International Reliability Physics Symposium, Phoenix, 2007.
Whitaker, Sterling R. et al: "Radiation Tolerance Techniques for a 1.6 Gb/s, 8 K and 4 K Low-Density Parity-Check Encoder," IEEE Journal of Solid-State Circuits, vol. 44, No. 6, Jun. 2009, pp. 1776-1784.
Kastensmidt, Fernanda Lima: "SEE Mitigation Strategies for Digital Circuit Design Applicable to ASIC and FPGAs," 2007 IEEE NSREC Short Course (86 pages).
INPI Search Report and Written Opinion for FR 1652999 dated Dec. 7, 2016 (9 pages).

*Primary Examiner* — Crystal L Hammond
(74) *Attorney, Agent, or Firm* — Gardere Wynne Sewell LLP

(57) ABSTRACT

A radiation-hardened logic device includes a first n-channel transistor coupled by its main conducting nodes between an output node of a logic device and a supply voltage rail and a first p-channel transistor coupled by its main conducting nodes between the output node of the logic device and a ground voltage rail. The gates of the first n-channel and p-channel transistors are coupled to the output node.

16 Claims, 4 Drawing Sheets

RADIATION-HARDENED CMOS LOGIC DEVICE

PRIORITY CLAIM

This application claims the priority benefit of French Application for Patent No. 1652999, filed on Apr. 5, 2016, the disclosure of which is hereby incorporated by reference.

TECHNICAL FIELD

The present disclosure relates to the field of radiation-hardened circuits, and in particular to a radiation-hardened CMOS logic device.

BACKGROUND

It is well known in the art to provide radiation-hardening by design for dealing with single event upsets (SEU) in sequential elements and storage devices, such as flip-flops, SRAM (static random access memory) devices, etc.

In the case of combinational logic cells, data is not retained. Therefore, the risk in such cells is not of an SEU, but of an SET (single event transient). An SET is a voltage transient that occurs momentarily, and can cause errors if it occurs when the data signal propagated by a logic cell is being clocked.

Combinational logic cells generally form a major part of digital circuit design, and, for example, are used to implement clock trees, data paths, logical cones, etc. There is thus a desire in the art to provide a reliable radiation-hardening solution for such circuits. A difficulty, however, is that any solution that involves the addition of new logic cells is generally unsatisfactory, as these new logic cells may themselves be a source of SETs.

There is accordingly a need in the art to at least partially address one or more problems in the prior art.

SUMMARY

According to one aspect, there is provided a radiation-hardened logic device comprising: a first n-channel transistor coupled by its main conducting nodes between an output node of a logic device and a supply voltage rail; and a first p-channel transistor coupled by its main conducting nodes between the output node of the logic device and a ground voltage rail, wherein the gates of the first n-channel and p-channel transistors are coupled to the output node.

According to one embodiment, the first n-channel transistor has its drain connected to the supply voltage rail and the first p-channel transistor has its drain connected to the ground voltage rail.

According to one embodiment, the logic device comprises: at least one further n-channel transistor formed in a same p-type well as the first n-channel transistor; and at least one further p-channel transistor formed in a same n-type well as the first p-channel transistor.

According to one embodiment, the at least one further n-channel transistor shares a common source/drain region with the first n-channel transistor; and the at least one further p-channel transistor shares a common source/drain region with the first p-channel transistor.

According to one embodiment, the sources of the n-channel and p-channel transistors are connected to the output node.

According to one embodiment, the gates of the n-channel and p-channel transistors are connected to the output node.

According to one embodiment, the gates of the first n-channel and p-channel transistors are coupled to the output node via a delay element.

According to one embodiment, the delay element comprises a second n-channel transistor and a second p-channel transistor each coupled by its main conducting nodes between the output node Z and the gates of the first n-channel and p-channel transistors.

According to one embodiment, the delay element comprises a third n-channel transistor coupled by its main conducting nodes between the output node Z and the gate of the first n-channel transistor, and a third p-channel transistor coupled by its main conducting nodes between the output node Z and the gate of the first p-channel transistor.

According to one embodiment, the logic device is a combinational logic cell.

According to one embodiment, the logic device is one of: an inverter; a NAND gate; a NOR gate; an AND gate; an OR gate; an XOR gate; and any combination of the above.

According to one embodiment, the first n-channel and p-channel transistors are each MOS transistors, and their main conducting nodes are their source and drain.

According to a further aspect, there is provided a non-transitory memory device storing a standard cell library comprising at least one standard cell defining the above radiation-hardened logic device.

According to a further aspect, there is provided a method of forming a radiation-hardened logic device comprising: forming, in a p-type well: a first n-channel transistor coupled by its main conducting nodes between an output node of a logic device and a supply voltage rail; and at least one further n-channel transistor of the logic device; and/or forming, in an n-type well: a first p-channel transistor coupled by its main conducting nodes between an output node of a logic device and a ground voltage rail; and at least one further p-channel transistor of the logic device.

According to one embodiment, the method further comprises connecting the drain of the first n-channel transistor to the supply voltage rail and connecting the drain of the first p-channel transistor to the ground voltage rail.

According to one embodiment, the method further comprises: forming the first n-channel transistor and the at least one further n-channel transistor to share a first common source/drain region; and/or forming the first p-channel transistor and the at least one further p-channel transistor to share a second common source/drain region.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present disclosure, the term "connected" is used to indicate a direct electrical connection between circuit elements or nodes, whereas the term "coupled" is used to indicate an electrical connection between circuit elements or nodes that may be direct, or may be via one or more intermediate elements such as capacitors, transistors, resistors, etc.

Figure 1:
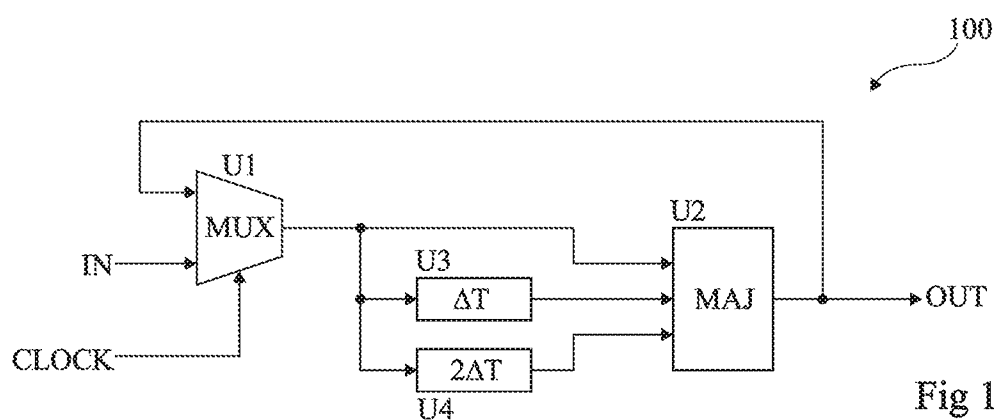
FIG. 1 schematically illustrates a temporal sampling latch with variable filtering delays.
Figure 3:
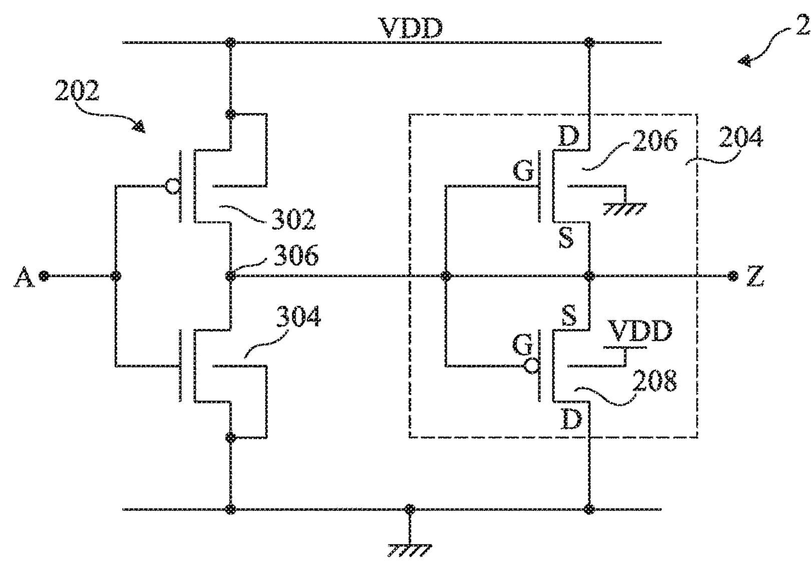
FIGS. 3 and 4 schematically illustrate radiation-hardened logic devices.

FIG. 1 schematically illustrates a temporal sampling latch 100 with variable filtering delays, and reproduces FIG. 3 of the publication by Mavis, et al., "SEU and SET Modelling and Mitigation in Deep Submicron Technologies", IEEE 07CH37867, 45th Annual International Reliability Physics Symposium, Phoenix, 2007.

The latch 100 comprises a multiplexer (MUX) U1 having its output provided to a majority gate (MAJ) U2 at three distinct times via three paths, one with no delay, one with a delay element U3 that introduces a delay ΔT, and one with a delay element U4 that introduces a delay 2ΔT. The majority gate U2 applies at its output the signal present on the majority of its input lines, and thus a transient occurring on any one input line will be filtered out.

A drawback with the solution of FIG. 1 is that, even if SETs propagated on the input lines of the majority gate can be filtered out, the addition of the majority gate U2 creates a new output node of the circuit, which can itself be the source of SETs. Furthermore, the solution of FIG. 1 introduces a capacitive load and applies a temporal filtering, which would lead to performance penalties.

Figure 2:
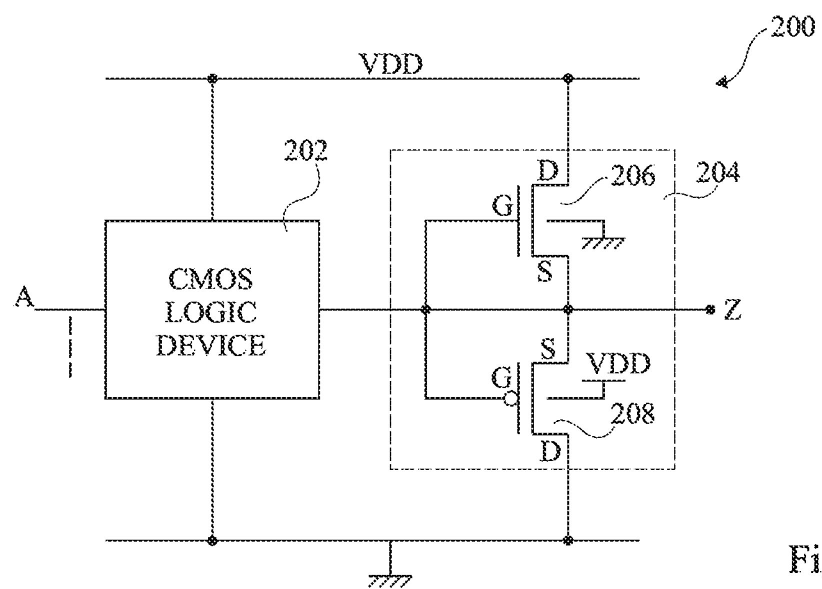
FIG. 2 schematically illustrates a radiation-hardened logic device.

FIG. 2 schematically illustrates a radiation-hardened logic device 200.

The device 200, for example, comprises a standard CMOS logic device (CMOS LOGIC DEVICE) 202 having its output node Z coupled to a radiation-hardening circuit 204. The output node Z also forms the output node of the radiation-hardened circuit 200, and thus no additional output node is created by the addition of the radiation-hardening circuit 204. The logic device 202 is supplied by a supply voltage VDD and a ground voltage, and, for example, receives an input signal A, and optionally one or more further input signals.

The radiation-hardening circuit 204, for example, comprises an n-channel transistor 206 coupled by its main conducting nodes between the output node Z and a supply voltage rail VDD, and a p-channel transistor 208 coupled by its main conducting nodes between the output node Z and the ground supply rail. The transistors 206 and 208 are, for example, MOS transistors. The main conducting nodes of a transistor are considered herein to be the nodes that conduct a current when the transistor is activated. For example, in the case of a MOS transistor, the main conducting nodes are the source and drain of the transistor. The transistor 206, for example, has its bulk connected to the ground voltage rail, and the transistor 208, for example, has its bulk connected to the supply voltage rail VDD. The sources of the transistors 206 and 208 are, for example, connected to the output node Z, and in the example of FIG. 2, the gates of the transistors 206 and 208 are also connected to the output node Z.

In FIG. 2, the transistors 206 and 208 each have their gate and source nodes coupled together, leading to a zero VGS (gate to source) voltage.

The n-channel transistor 206 is, for example, formed in a same p-type well (p-well) as at least one of the n-channel transistors (not illustrated in FIG. 2) forming the CMOS logic device 202. Similarly, the p-channel transistor 208 is, for example, formed in a same n-type well (n-well) as at least one of the p-channel transistors (not illustrated in FIG. 2) forming the CMOS logic device 202. In this way, the impact of radiation at the drains of the transistors of the CMOS logic device 202 will be reduced. Indeed, as the drains of the transistors 206 and 208 are connected directly to the voltage supply rails, they will more efficiently collect radiation-induced carriers than the drains of the transistors of the CMOS logic device 202.

Thus, a method of forming a radiation hardened logic device, for example, comprises forming the n-channel transistor 206 and at least one further n-channel transistor of the logic device 202 in a p-type well, and/or forming the p-channel transistor 208 and at least one further p-channel transistor of the logic device 202 in an n-type well. As will be described in more detail below, in some embodiments, the n-channel transistor 206 shares a common source/drain region with the at least one further n-channel transistor of the logic device 202, and/or the p-channel transistor 208 shares a common source/drain region with the at least one further p-channel transistor of the logic device 202.

The radiation-hardened logic device 200 is, for example, a standard cell defined in a standard cell library for use in circuit conception. Additionally or alternatively, the radiation-hardened logic device 200 may form part of a radiation-hardened electronic circuit of an electronics device such as a computer, mobile communications device, etc., in which some or all of the logic devices are radiation-hardened as described herein. For example, such a radiation-hardened electronic circuit could have applications in the medical, automotive, network, spatial, or defense fields.

FIG. 3 schematically illustrates the radiation-hardened logic device 200 of FIG. 2 in more detail in the case that the CMOS logic device 202 is an inverter formed by a p-channel transistor 302 and an n-channel transistor 304 coupled in series with each other via their main conducting nodes between the supply voltage rail VDD and the ground voltage rail. The gates of the transistors 302 and 304 are coupled to an input node A, and the drains of the transistors 302 and 304 are coupled together to a node 306, which forms the output node Z of the device.

The n-channel transistors 206 and 304 are, for example, formed in a common p-type well, and the p-channel transistors 208 and 302 are, for example, formed in a common n-type well.

Figure 4:
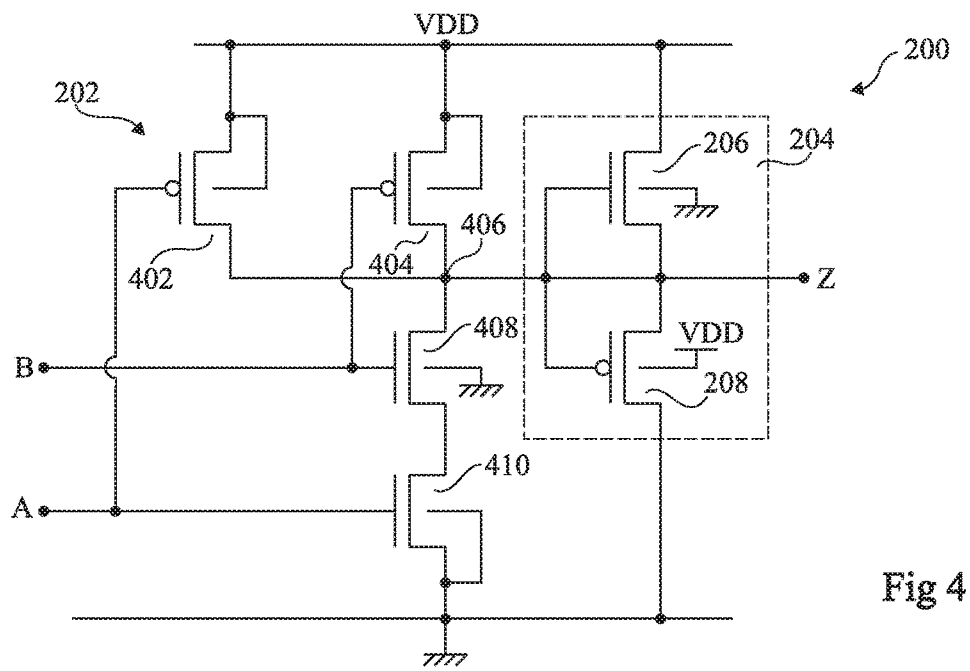

FIG. 4 schematically illustrates the radiation-hardened logic device 200 of FIG. 2 in more detail in the case that the CMOS logic device 202 is a NAND gate. In particular, the device 202 is, for example, formed of p-channel transistors 402 and 404 coupled in parallel with each other by their main conducting nodes between the supply voltage rail VDD and a node 406, which forms the output node Z of the device. Furthermore, n-channel transistors 408 and 410 are coupled in series with each other via their main conducting nodes between the output node 406 and ground voltage rail. The gates of transistors 402 and 410 are, for example, coupled to an input line A, and the gates of transistors 404 and 408 are, for example, coupled to an input line B.

The n-channel transistors 206, 408 and 410 are, for example, formed in a common p-type well, and the p-channel transistors 208, 402 and 404 are, for example, formed in a common n-type well.

While FIGS. 3 and 4 respectively provide examples in which the logic device 202 is an inverter and a NAND gate, in alternative embodiments, the logic device could be any combinational logic device, such as one of the following list:

an inverter;

a NAND gate;

a NOR gate;

an AND gate;

an OR gate;

an XOR gate; and any combination of the above.

In some embodiments, all of the n-channel transistors of the logic device 202 are formed in a common p-well with the n-channel transistor 206, and/or all of the p-channel transistors of the logic device 202 are formed in a common n-well with the p-channel transistor 208.

Figure 5B:
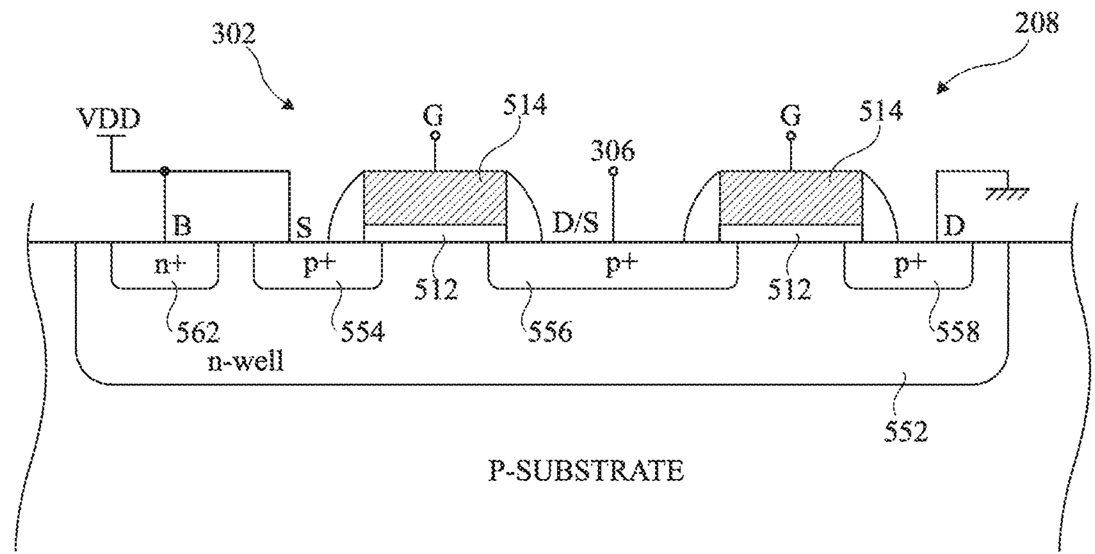
FIG. 5B is a cross-section view of an n-type well having p-channel transistors formed therein.
Figure 5A:
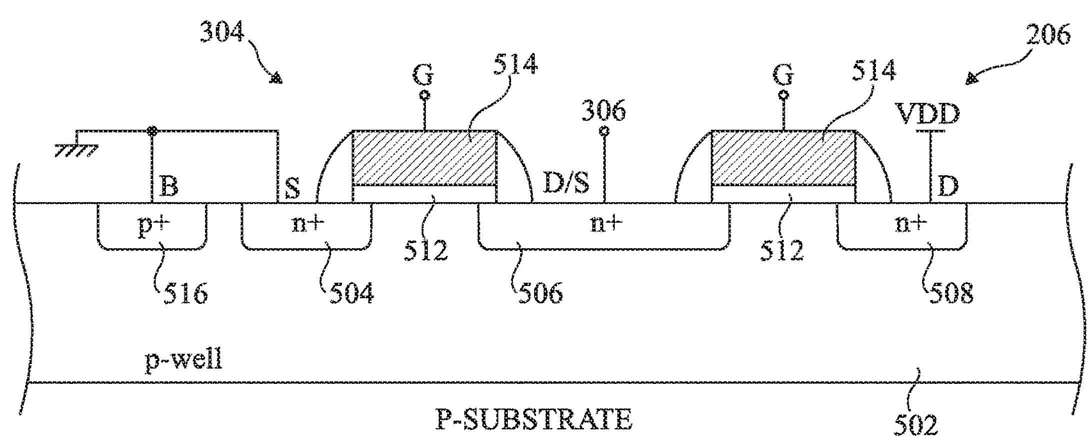
FIG. 5A is a cross-section view of a p-type well having n-channel transistors formed therein.

FIG. 5A is a cross-section view of a p-type well (p-well) 502 within which are formed the n-channel transistors 206 and 304 of the inverter of FIG. 3. The p-well 502 is, for example, formed over a p-type substrate (P-SUBSTRATE), and has a heavily doped n-type (n+) region 504 forming a source of the transistor 304, an n+ region 506 forming a shared common drain/source region of the transistors 304 and 206, and an n+ region 508 forming a drain of the transistor 206. Gate stacks are formed over the regions separating the source and drain of each transistor 304, 206, each gate stack, for example, comprising a layer 512 of an insulator such as oxide covered by a gate conductor 514, for example formed of a metal or metal silicide. Spacers may be formed on the sides of the gate stacks.

The common drain/source region 506 is, for example, connected to the node 306. The drain 508 of transistor 206 is, for example, connected to the supply voltage rail VDD. The source 504 of transistor 304 is, for example, connected to the ground voltage rail. The transistor 304, for example, comprises a bulk connection formed by a heavily doped p-type (p+) region 516 formed in the p-well 502 and connected to the ground voltage rail.

FIG. 5B is a cross-section view of an n-type well (n-well) 552 within which are formed the p-channel transistors 208 and 302 of the inverter of FIG. 3. The n-well 552 is, for example, formed over a p-type substrate (P-SUBSTRATE), and has a p+ region 554 forming a source of the transistor 302, a p+ region 556 forming a shared common drain/source region of the transistors 302 and 208, and a p+ region 558 forming a drain of the transistor 208. Gate stacks are formed over the regions separating the source and drain of each transistor 302, 208, each gate stack, for example, comprising a layer 512 of an insulator such as oxide covered by a gate conductor 514, for example, formed of a metal or metal silicide. Spacers may be formed on the sides of the gate stacks.

The common drain/source region 556 is, for example, connected to the node 306. The drain 558 of transistor 208 is, for example, connected to the ground voltage rail. The source 554 of transistor 302 is, for example, connected to the supply voltage rail VDD. The transistor 302, for example, comprises a bulk connection formed by an n+ region 562 formed in the n-well 552 and connected to the supply voltage rail VDD.

While FIGS. 5A and 5B illustrate an example based on an inverter, in the case of other logic devices, additional transistors may be formed in the p-well 502 of FIG. 5A and/or in the n-well 552 of FIG. 5B.

Figure 6A:
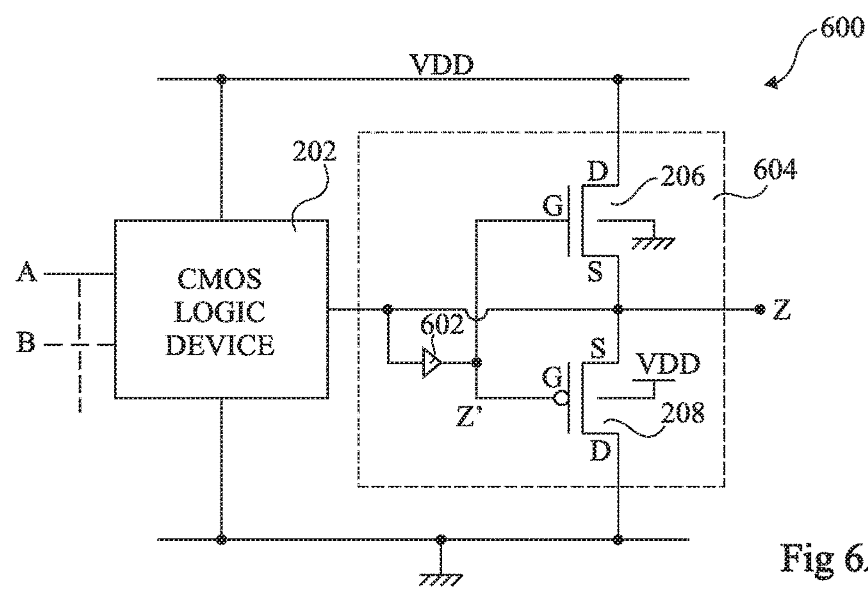
FIG. 6A schematically illustrates a radiation-hardened logic device.

FIG. 6A illustrates a radiation-hardened logic device 600 according to an alternative embodiment to that of FIG. 2.

The circuit of FIG. 6A is similar to that of FIG. 2, except that the radiation-hardening circuit 204 is replaced by a radiation-hardening circuit 604 in which the gates of the transistors 206 and 208 are coupled to the output node Z of the CMOS logic device (CMOS LOGIC DEVICE) 202 via a delay element 602. The delay element 602 introduces a time delay between the voltages present at the gates and sources of the transistors 206 and 208. As will now be described in more detail with reference to FIG. 6B, when there is a radiation impact, this time delay means that the gate-source voltage (VGS) of the transistors 206, 208 will temporarily not be identical, leading to an increase in the current driven by the transistor 206 or 208, thereby reinforcing the radiation-hardening of the circuit.

Figure 6B:
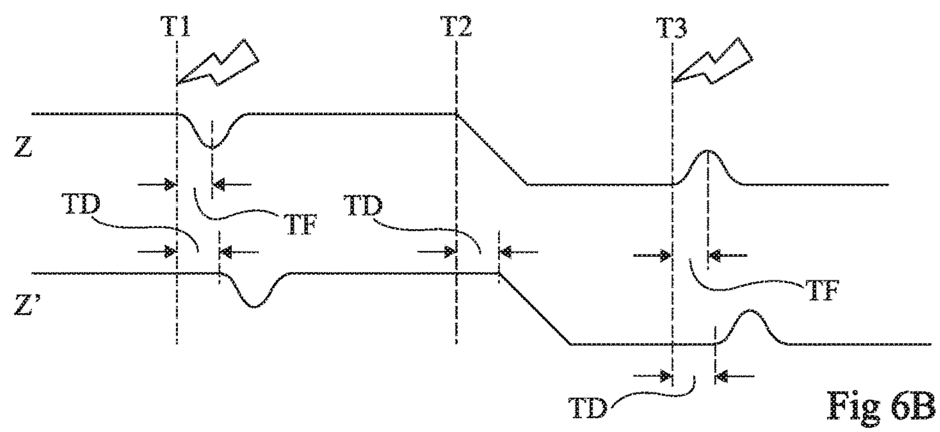
FIG. 6B is a timing diagram illustrating an example of signals in the circuit of FIG. 6A.

FIG. 6B is a timing diagram illustrating examples of the signals at the output node Z of the logic device 202 and at the gates Z' of the transistors 206 and 208 of the radiation-hardening circuit 604, which in the example of FIG. 6A are coupled together. It is assumed that initially the signals at the nodes Z and Z' are at around the supply voltage VDD.

At a time T1, radiation strikes an n-channel transistor in the CMOS logic device 202, causing the voltage at the output node Z to start to fall. The voltage drop will start to be corrected by the supply voltage provided by the drain of the n-channel transistor 206. Furthermore, the signal at the node Z' is not affected immediately in view of the delay element 602. Thus, the n-channel transistor 206 will have a positive gate-source voltage VGS, and will start to conduct. This will cause the output voltage Z to return faster to the supply voltage level VDD, thereby improving robustness of the circuit. The voltage at the node Z' will follow that of the node Z after the time delay TD of the delay element 602, which is, for example, chosen to be greater than the fall time TF of the signal Z when the radiation strikes.

At a time T2, it is assumed that a data transition occurs, the voltage level at the node Z falling from a high level to a low level, and the voltage at the node Z' falling in a similar fashion after the time delay TD.

At a time T3, radiation strikes a p-channel transistor in the CMOS logic device 202, causing the voltage at the output node Z to start to rise. The voltage rise will start to be corrected by the ground voltage provided by the drain of the p-channel transistor 208. Furthermore, the signal at the node Z' is not affected immediately in view of the delay element 602. Thus, the p-channel transistor 208 will have a negative gate-source voltage VGS, and will start to conduct. This will cause the output voltage Z to return faster to the ground voltage level, thereby improving robustness of the circuit. The voltage at the node Z' will follow that of the node Z after the time delay TD of the delay element 602.

In one embodiment, the delay element 602 of FIG. 6A is formed by a pair of inverters coupled in series. Alternatively, the delay element 602 could be formed by a pair of transistors, as will now be described with reference to FIGS. 7A and 7B.

Figure 7A:
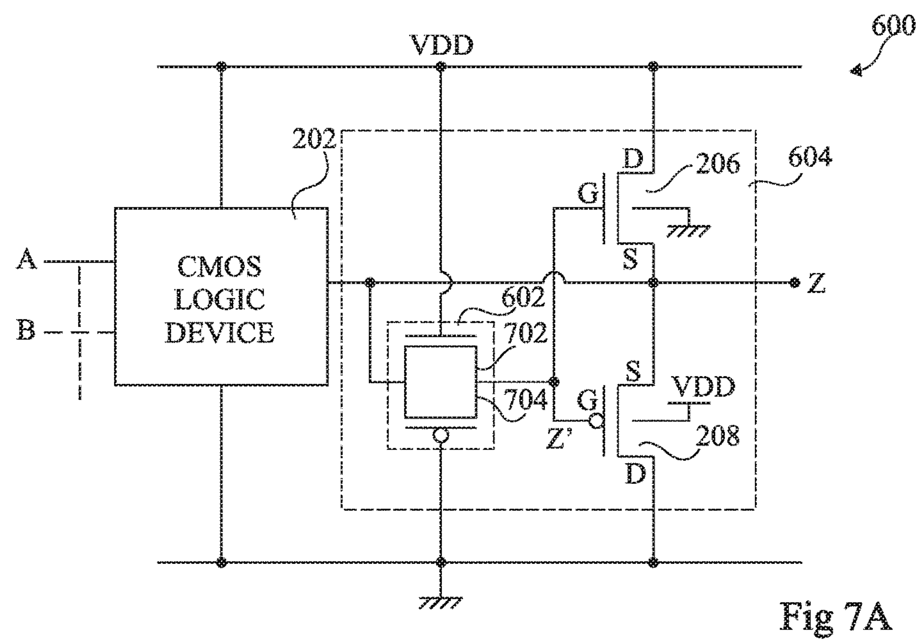
FIG. 7A schematically illustrates the radiation-hardened logic device of FIG. 6A in more detail.

FIG. 7A illustrates the radiation-hardened logic device 600 of FIG. 6A in more detail according to an example in which the delay element 602 is formed by an n-channel transistor 702 and a p-channel transistor 704. Each of the transistors 702, 704 is coupled by its main conducting nodes between the output Z of the logic device 202 and the gates of the transistors 206 and 208. The gate of transistor 702 is coupled to the VDD supply voltage rail, and the gate of transistor 704 is coupled to the ground voltage rail, such that the transistors 702 and 704 are permanently conducting, and will introduce a time delay between the output Z and the gates of transistors 206, 208.

Figure 7B:
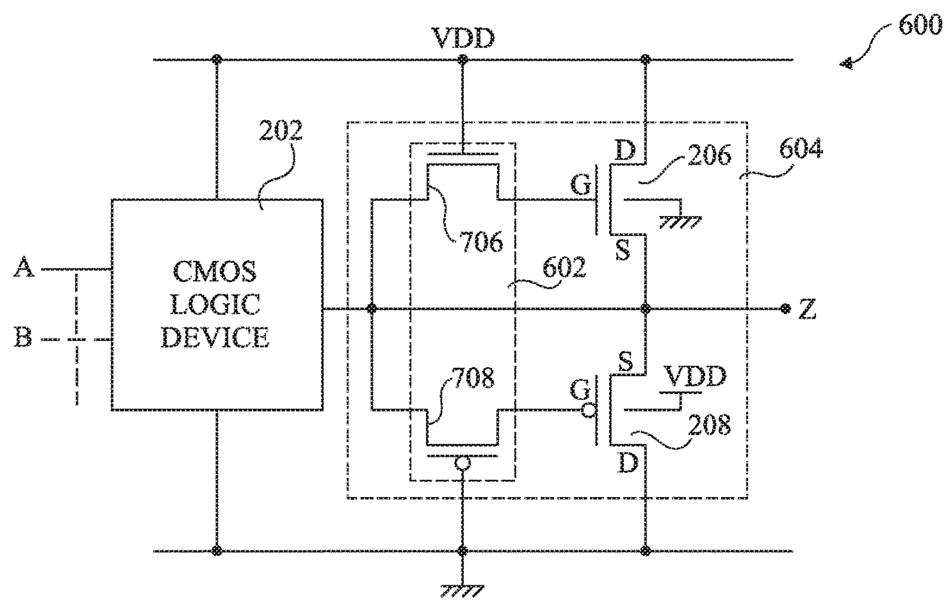
FIG. 7B schematically illustrates a radiation-hardened logic device.

FIG. 7B illustrates the radiation-hardened latch 600 according to an alternative embodiment in which the delay element 602 comprises an n-channel transistor 706 coupled by its main conducting nodes between the output Z of the logic device 202 and the gate of the transistor 206, and a p-channel transistor 708 coupled by its main conducting nodes between the output Z of the logic device 202 and the gate of the transistor 208. Thus, in the embodiment of FIG. 7B the gates of the transistors 206 and 208 are not connected together. The gate of the transistor 706 is coupled to the VDD supply voltage rail, and the gate of the transistor 708 is coupled to the ground voltage rail, such that the transistors 706 and 708 are permanently conducting, and will introduce a time delay between the output Z and the gates of the transistors 206 and 208 respectively.

Figure 8:
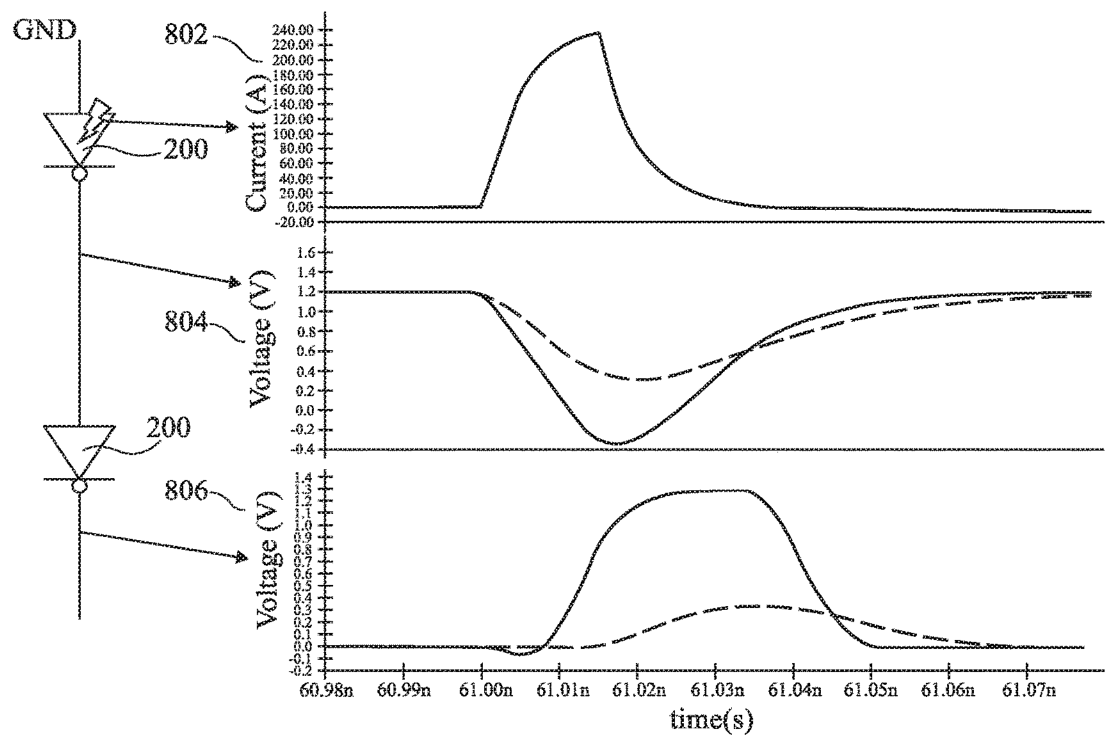
FIG. 8 represents simulated performance of a radiation-hardened inverter.

FIG. 8 represents simulated performance of the radiation-hardened inverter 200 of FIG. 2. It is assumed that two of the inverters 200 are coupled in series, and that a first of the inverters is hit by radiation.

A graph 802 in FIG. 8 represents the current conducted by the first inverter when hit by the radiation at a time of 61 ns into the simulation. The current, for example, rises from a zero level to a level of 240 μA.

A graph 804 in FIG. 8 represents, by a dashed curve, the output voltage of the first inverter, which has a significantly reduced voltage drop when compared to a standard inverter represented by the solid curve in FIG. 8.

A graph 806 in FIG. 8 represents, by a dashed curve, the output voltage of the second inverter, which has a significantly reduced voltage rise when compared to a standard inverter represented by the solid curve in FIG. 8.

An advantage of the embodiments of the present disclosure is that a logic device can be radiation-hardened by a simple circuit having a relatively low surface area and without creating new nodes, which could themselves be the source of SETs. Furthermore, the impact of the circuit on performance is relatively low. Indeed, the present inventors have found that, simulated with respect to a standard inverter and assuming cells with a fan-out of 4, the performance impact is only around 10 percent.

Having thus described at least one illustrative embodiment, various alterations, modifications and improvements will readily occur to those skilled in the art. For example, it will be apparent to those skilled in the art that the supply voltage VDD in the various embodiments could be at any level, for example between 0.6 and 3 V, and rather than being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination. For example, the radiation-hardening circuit 604 of FIG. 6A could be incorporated in the circuits of FIG. 3 or 4 in place of the radiation-hardening circuit 204.

The invention claimed is:

1. A radiation-hardened logic device, comprising:

a first n-channel transistor coupled by main conducting nodes between an output node of a logic device and a supply voltage rail; and a first p-channel transistor coupled by main conducting nodes between the output node of the logic device and a ground voltage rail, wherein gates of the first n-channel and p-channel transistors are coupled to the output node.

2. The radiation-hardened logic device of claim 1, wherein the first n-channel transistor has a drain connected to the supply voltage rail and the first p-channel transistor has a drain connected to the ground voltage rail.

3. The radiation-hardened logic device of claim 1, wherein the logic device comprises:

at least one further n-channel transistor formed in a same p-type well as the first n-channel transistor; and at least one further p-channel transistor formed in a same n-type well as the first p-channel transistor.

4. The radiation-hardened logic device of claim 3, wherein:

the at least one further n-channel transistor shares a common source or drain region with the first n-channel transistor; and the at least one further p-channel transistor shares a common source or drain region with the first p-channel transistor.

5. The radiation-hardened logic device of claim 1, wherein sources of the n-channel and p-channel transistors are connected to the output node.

6. The radiation-hardened logic device of claim 1, wherein the gates of the n-channel and p-channel transistors are connected to the output node.

7. The radiation-hardened logic device of claim 1, wherein the gates of the first n-channel and p-channel transistors are coupled to the output node via a delay element.

8. The radiation-hardened logic device of claim 7, wherein the delay element comprises a second n-channel transistor and a second p-channel transistor each coupled by main conducting nodes between the output node and the gates of the first n-channel and p-channel transistors.

9. The radiation-hardened logic device of claim 7, wherein the delay element comprises a third n-channel transistor coupled by main conducting nodes between the output node and the gate of the first n-channel transistor, and a third p-channel transistor coupled by main conducting nodes between the output node and the gate of the first p-channel transistor.

10. The radiation-hardened logic device of claim 1, wherein the logic device is a combinational logic cell.

11. The radiation-hardened logic device of claim 10, wherein the logic device is one of:

an inverter;

a NAND gate;

a NOR gate;

an AND gate;

an OR gate;

an XOR gate; and any combination of the above.

12. The radiation-hardened logic device of claim 1, wherein the first n-channel and p-channel transistors are each MOS transistors, and the main conducting nodes are sources and drains.

13. A non-transitory memory device storing a standard cell library comprising at least one standard cell defining a radiation-hardened logic device, comprising:

a first n-channel transistor coupled by main conducting nodes between an output node of a logic device and a supply voltage rail; and a first p-channel transistor coupled by main conducting nodes between the output node of the logic device and a ground voltage rail, wherein gates of the first n-channel and p-channel transistors are coupled to the output node.

14. A method of forming a radiation-hardened logic device, comprising:

forming, in a p-type well:

a first n-channel transistor coupled by its main conducting nodes between an output node of a logic device and a supply voltage rail; and at least one further n-channel transistor of the logic device; and/or forming, in an n-type well:

a first p-channel transistor coupled by its main conducting nodes between an output node of a logic device and a ground voltage rail; and at least one further p-channel transistor of the logic device.

15. The method of claim 14, further comprising connecting the drain of the first n-channel transistor to the supply voltage rail and connecting the drain of the first p-channel transistor to the ground voltage rail.

16. The method of claim 14, further comprising:

forming the first n-channel transistor and the at least one further n-channel transistor to share a first common source/drain region; and forming the first p-channel transistor and the at least one further p-channel transistor to share a second common source/drain region.

* * * * *